United States Patent [19]
Verdiell et al.

[11] Patent Number: 5,097,478
[45] Date of Patent: Mar. 17, 1992

[54] RING CAVITY LASER DEVICE

[75] Inventors: Jean-Marc Verdiell, Beltsville, Md.; Jean-Pierre Huignard, Paris, France

[73] Assignee: Thomson-CSF, Puteaux, France

[21] Appl. No.: 620,029

[22] Filed: Nov. 30, 1990

[30] Foreign Application Priority Data

Dec. 1, 1989 [FR] France ................ 89 15879

[51] Int. Cl.$^5$ ............................. H01S 3/083
[52] U.S. Cl. ........................ 372/94; 372/18; 372/21
[58] Field of Search .................... 372/94, 21, 18

[56] References Cited

U.S. PATENT DOCUMENTS 5,027,360  6/1991  Nabors et al. ................ 372/18
5,034,951  7/1991  Edelstein et al. ............. 372/18

OTHER PUBLICATIONS

Optics Letters, vol. 14, No. 21, Nov. 1, 1989, pp. 1189-1191, C. D. Nabors, et al., "Injection Locking of a 13-W CW ND:YAG Ring Laser".
IEEE Journal of Quantum Electronics, vol. 25, No. 2, Feb. 1989, pp. 201-207, G. Pauliat, et al., "Analysis of the Build Up of Oscillations in Self-Induced Photorefractive Light Resonators".

*Primary Examiner*—James W. Davie
*Attorney, Agent, or Firm*—Oblon, Spivak, McClelland, Maier & Neustadt

[57] ABSTRACT

A ring cavity laser device includes a slave laser placed in a ring cavity. The injection locking of a beam emitted by a master laser is achieved by a non-linear material in which interference occurs between the master laser beam and the beam circulating in the ring.

6 Claims, 2 Drawing Sheets

RING CAVITY LASER DEVICE

BACKGROUND OF THE INVENTION

The invention concerns a ring cavity laser device and, more precisely, a device using the optical beam emitted by a master laser to control or lock the operation of a slave laser located in a ring cavity.

This "injection locking" consists in controlling a laser hereinafter referred to as the "slave", generally powerful yet having poor coherence (longitudinal multimode) and divergence (transverse multimode), by a laser of lower power known as the "master", which is very coherent and whose divergence is limited by diffraction. To achieve this, the light from the master laser is injected into the cavity of the slave laser. Once the injection locking is established, the slave laser possesses the properties of coherence and divergence inherited from the master while conserving its power.

One of the difficulties of this technique is the necessary insulation between the slave and the master: the light from the master must be coupled to that of the slave very efficiently yet, on the other hand, the inverse must be avoided since the master would otherwise be disturbed. This is particularly true in the case of semiconductor lasers, where an insulation of more than 30 dB between slave and master is required.

To achieve this unidirectional insulation optical insulators using the Faraday effect are employed. These are large, heavy and expensive.

For example, devices in which a laser, called the slave, is constituted by an amplifying medium placed in a Fabry-Perot type optical cavity are well known. As shown in FIG. 1, the slave laser 3 with its cavity constituted by the mirrors 5 and 6, receives from a master laser 1 a master beam Fm. The wavelength of the slave laser and therefore that of the beam FS emitted by the optical cavity is controlled by the master beam Fm.

It is essential for the operation of the master laser 1 to take precautions against return of light from the slave optical cavity. This is achieved by use of an insulator 7.

Devices such as that shown in FIG. 2 are also known. These possess an optical ring cavity formed by the mirrors M6, M7 and M8 and containing the amplifying medium. The mirror M6 allows the injection of a master beam Fm, supplied by a master laser 1, into the ring cavity.

The mirror 8 is half-reflecting and allows the output beam FS to exit the cavity.

In addition, in injection locking devices, the frequency of the master laser and that of the slave, which both oscillate freely (without injection), must be approximately the same in order to fall in the locking range. To achieve this, we may choose between modifying the frequency of the master laser or that of the slave by adjusting, for example, the length of the ring.

SUMMARY OF THE INVENTION

The present invention proposes a locking technique in laser ring cavities which maximizes the coupling between master and slave lasers while avoiding the need for insulators by the use of a non-linear medium.

In addition, as mentioned previously, in injection locking ring cavity devices the length must be carefully adjusted. The invention overcomes this problem by making the adaptation of the slave cavity automatic (unconditional locking).

The invention therefore concerns a ring cavity laser device including an optical cavity in the form of a ring, with an amplifying medium situated in this cavity, constituting a slave laser. A master laser emits a light beam (Fm) which is injected into the optical cavity to control the slave laser, which is characterized by the fact that it includes a device of non-linear material located in the optical cavity receiving the light beam from the master laser which plays a role of signal beam (Fs) for the non-linear material. The optical wave circulating in the optical cavity takes the role of a pump.

BRIEF DESCRIPTION OF THE DRAWINGS

The different purposes and characteristics of the invention will be more clearly understood in the description below, given as an example, and by examining the figures in the appendix which show.

DETAILED DESCRIPTION OF THE INVENTION

Figure 1:
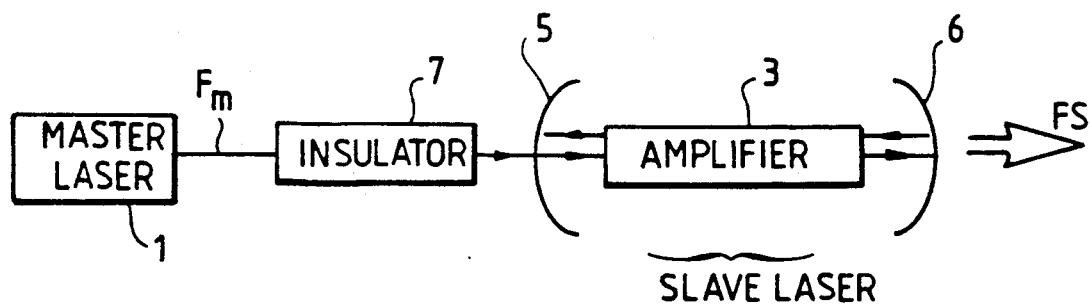
FIGS. 1 and 2: known devices described previously.
Figure 2:
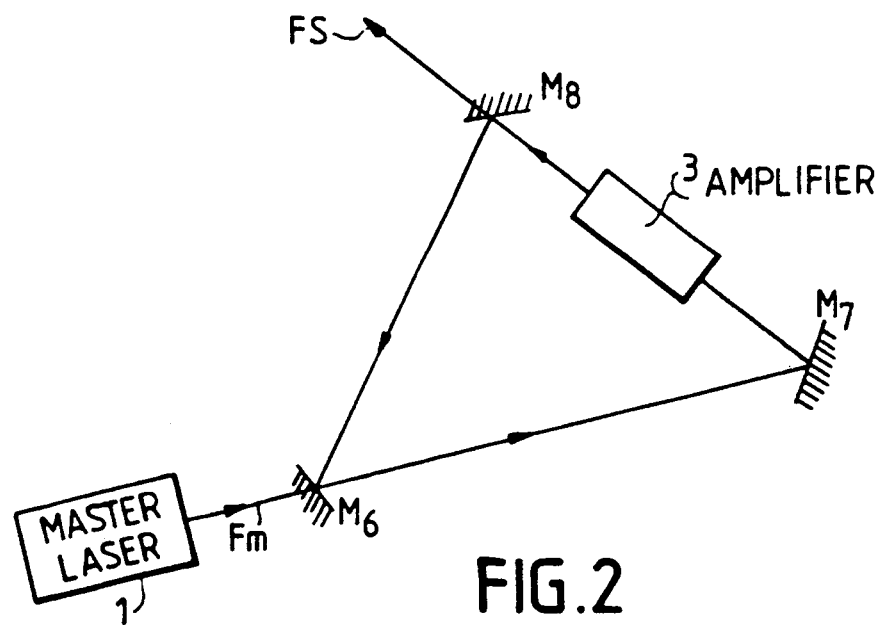
Figure 3:
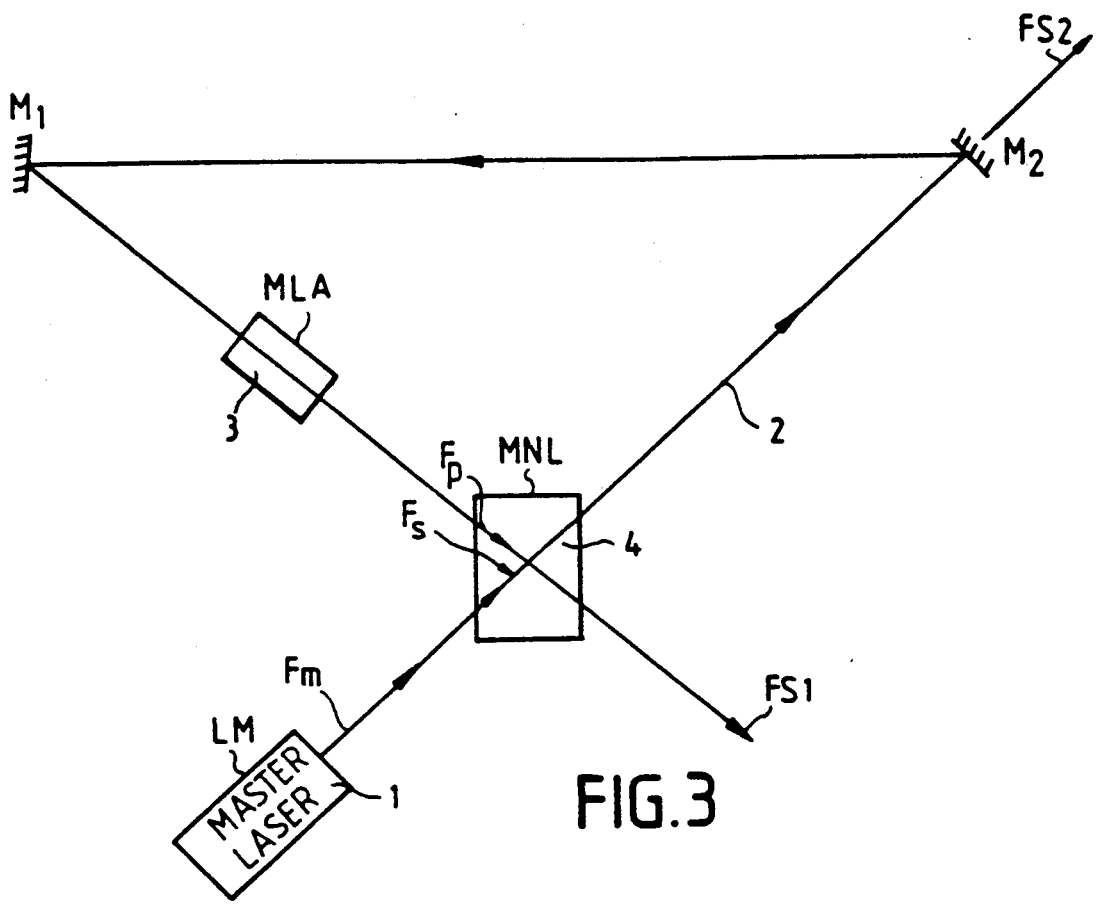
FIG. 3: an example of the device according to the invention.

The laser device shown in FIG. 3 includes an amplifying medium 3 placed in a ring cavity 2 closed by the mirrors M1 and M2 and a device 4 of non-linear material. A master laser 1 emits a master beam Fm towards the device 4 of non-linear material to be injected into the optical cavity 2.

The laser comprises an amplifying laser medium 3 MLA (of semiconductor, solid, liquid or gaseous type), or even a network of these components, and a ring cavity 2.

The non-linear material of the device 4 is, for example, a photorefractive crystal of $BaTiO_3$, BSO or GaAsQ.

In the absence of emission by the master laser 1, the cavity 2 is not closed and the slave laser does not operate.

The master laser beam 1 is directed onto the device 4 of non-linear material in such a way that it is adapted to a spatial mode of the cavity 2. In the example shown in FIG. 3, the direction is such that the master beam Fm takes the place of a probe beam Fs for the non-linear medium 4.

Having traversed the non-linear medium and reflected from the mirrors M1 and M2, the probe beam Fs traverses the amplifying laser medium 3. After amplification the beam leaves this medium 3 and serves as a pump beam Fp for an two wave interaction with the probe beam Fs, from the master laser, in the non-linear medium. Thanks to this two wave interaction part of the energy of the pump wave Fp is transferred to the probe beam Fs and is therefore deviated again to the mirror M2. The cavity 2 is therefore reclosed and the laser effect takes place, locked onto the phase and frequency of the master laser. Since the phase at the output from the non-linear medium (device 4) is controlled only by the master, the injection locking is unconditional: the same frequency between the modes of the two cavities is not necessary, the phase in the slave cavity adapts automatically to that of the master. Neither is it necessary to use an insulator between the master laser 1 and the slave laser, since no return of the slave beam is directed towards the master.

The output beam of the cavity can be comprised of part of the pump beam not diffracted by the non-linear medium 4 (zero order diffraction), referenced Fs1 in the diagram.

It would also be possible to make one of the mirrors, M2 for example, semi-transparent. The output beam referenced Fs2 in FIG. 3 could then be extracted.

We note also that all the energy of the master beam is coupled to the slave cavity (there is no return by reflection on a mirror as in the classical case), which means that the injection efficiency is maximized.

Figure 4:
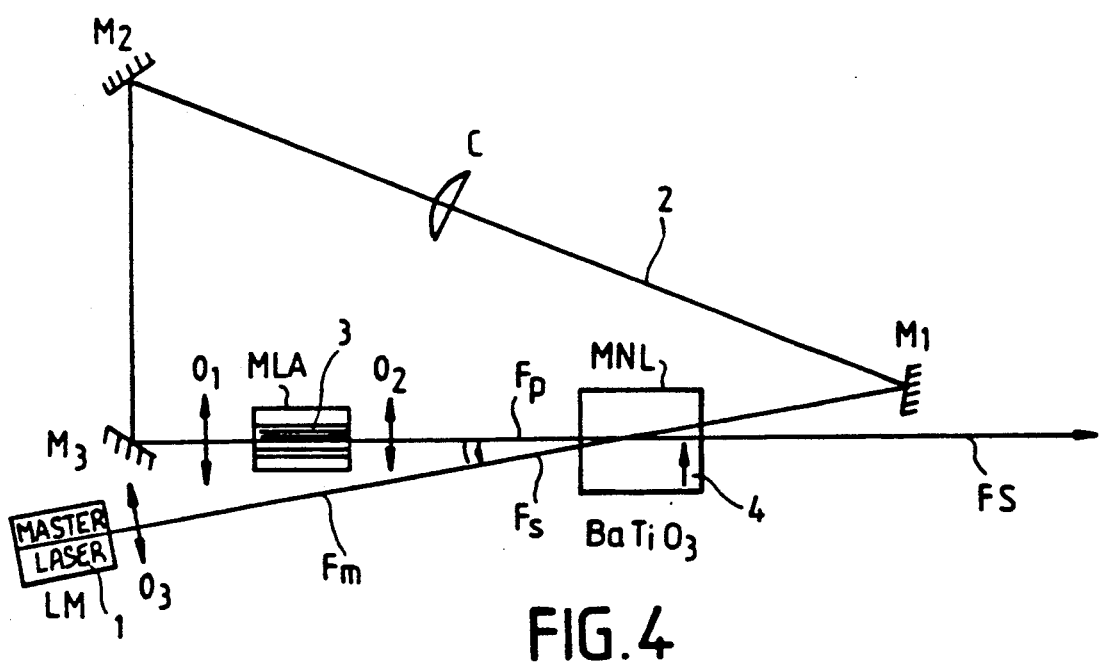
FIG. 4: a variant of the device according to the invention.

FIG. 4 shows another example of the laser device according to the invention.

In this device the slave laser 3 is a network of lasers. A cylindrical lens C is then included to adapt the size of the beam to the useful input face of the laser network 3. The lenses $O_1$ and $O_2$, situated on each side of the slave laser 3, also allow the shaping of the incoming and outgoing slave beam.

According to the example, the device 4 is made from a material necessitating a relatively small angle between the probe beam Fs and the pump beam Fp.

For example, the various parts of the device in FIG. 4 could be made as follows:

Master laser 1: semiconductor diode laser guided by the index, P about 10 mW, longitudinal and transverse monomode;

Slave laser 3: network of 10 semiconductor laser diodes guided by the gain, P about 200 mW;

M1, M2, M3: mirrors;

$O_1$, $O_2$, $O_3$: focussing objectives;

C: cylindrical lens;

Device 4 of non-linear material: crystal of barium titanate requiring an angle of about 20° between the probe laser (master laser Fm) and the pump laser (beam circulating in cavity 2).

The laser device 2 of the invention can be useful in the following applications:

Semiconductor sources of power limited by diffraction (case where MLA is a network of diode lasers);

Laser sources frequency stabilized on a local oscillator;

All injection-locked laser sources.

It is clear that the preceding description is a non-restrictive example and that other variants can be envisaged within the frameworkf of the invention. The numerical examples and the natures of the materials are given only to illustrate the description.

What is claimed is:

1. A ring cavity laser device comprising:
    an optical ring cavity for circulating an optical wave,
    an amplifying medium, located in the optical ring cavity, for forming a slave laser,
    a master laser for emitting a master light beam which is injected into the optical ring cavity for operation of the slave laser, and
    a non-linear material situated in the optical ring cavity for receiving the master light beam of the master laser, the master light beam traversing the non-linear medium forming a signal beam at the non-linear material, the optical wave circulating in the optical cavity, and emitted by the slave laser, forming a pump wave at the non-linear material.

2. A laser device according to claim 1, wherein the optical ring cavity includes reflective devices to close the cavity, the non-linear material also forming a reflection device to close the ring cavity.

3. A laser according to claim 2, wherein one of the reflective devices is semi-transparent to allow exit of the optical wave circulating in the optical ring cavity.

4. A laser device according to claim 1, wherein the non-linear material transmits a part of the energy of the optical wave circulating in the optical ring cavity in a direction co-linear to the pump wave at the non-linear material.

5. A laser device according to claim 1, wherein the slave laser is a laser network, focussing devices being associated with both an input and an output of the slave laser.

6. A laser device according to claim 1, wherein the non-linear material is of $BaTiO_3$.

* * * * *